(12) United States Patent
Chou et al.

(10) Patent No.: US 7,717,696 B2
(45) Date of Patent: May 18, 2010

(54) APPARATUS FOR DOUBLE-SIDED IMPRINT LITHOGRAPHY

(75) Inventors: Stephen Chou, Princeton, NJ (US);
Linshu Kong, Plainsboro, NJ (US);
Colby Steere, Parsippany, NJ (US);
Mingtao (Gary) Li, Boise, ID (US);
Hua Tan, South Bound Brook, NJ (US);
Lin Hu, Livingston, NJ (US)

(73) Assignee: Nanonex Corp., Princeton, NJ (US)

( * ) Notice: Subject to any disclaimer, the term of this patent is extended or adjusted under 35 U.S.C. 154(b) by 1143 days.

(21) Appl. No.: 10/918,564

(22) Filed: Aug. 13, 2004

(65) Prior Publication Data

US 2005/0146078 A1 Jul. 7, 2005

Related U.S. Application Data

(60) Continuation-in-part of application No. 10/140,140, filed on May 7, 2002, now Pat. No. 7,137,803, which is a division of application No. 09/618,174, filed on Jul. 18, 2000, now Pat. No. 6,482,742.

(60) Provisional application No. 60/495,560, filed on Aug. 15, 2003.

(51) Int. Cl.
*B29C 59/00* (2006.01)

(52) U.S. Cl. .................... 425/400; 425/385; 425/387.1; 425/394; 425/419; 425/468; 425/470; 425/810; 101/485; 216/44; 216/52; 264/293

(58) Field of Classification Search ................ 264/239, 264/299, 319, 340, 293, 101, 132, 571; 425/383, 425/406, 405.1, 385, 363, 412–416, 423, 425/387.1, 389, 390, 405.2, 143, 150, 169–172, 425/810, 184, 234, 388, 394, 396, 400, 403, 425/419, 461, 466, 468, 470; 101/28, 485, 101/486; 216/44, 52, 53
See application file for complete search history.

(56) References Cited

U.S. PATENT DOCUMENTS

| 5,626,885 | A | * | 5/1997 | Vromans | ..................... 425/110 |
| 5,772,905 | A | * | 6/1998 | Chou | ........................... 216/44 |
| 5,820,794 | A | * | 10/1998 | Jung | .......................... 264/1.33 |
| 5,947,027 | A | * | 9/1999 | Burgin et al. | ................ 101/474 |

(Continued)

FOREIGN PATENT DOCUMENTS

JP 01214042 A * 8/1989

(Continued)

*Primary Examiner*—Philip C Tucker
*Assistant Examiner*—Dimple N Bodawala
(74) *Attorney, Agent, or Firm*—Polster Lieder Woodruff & Lucchesi, LC

(57) ABSTRACT

Apparatus for double-sided imprint lithography of an apertured substrate comprises a pair of correspondingly apertured molds, a support for an assembly of the substrate and molds, and an alignment mechanism with radially movable elements for aligning the apertures of the molds and the substrate. The movable elements can be at least partially disposed in a spindle and can be removed radially outward by a conically tapered drive rod. Opposing surfaces of the substrate can then be imprinted in registration at the same time, preferably by fluid pressure imprint lithography.

14 Claims, 12 Drawing Sheets

U.S. PATENT DOCUMENTS

| | | | |
|---|---|---|---|
| 6,184,972 B1 * | 2/2001 | Mizutani et al. | 355/72 |
| 6,210,609 B1 * | 4/2001 | Takeda et al. | 264/1.33 |
| 6,257,866 B1 * | 7/2001 | Fritz et al. | 425/387.1 |
| 6,955,767 B2 * | 10/2005 | Chen | 216/40 |
| 7,082,876 B2 * | 8/2006 | Olsson | 101/483 |
| 7,137,803 B2 * | 11/2006 | Chou | 425/405.1 |
| 7,144,539 B2 * | 12/2006 | Olsson | 264/293 |
| 7,252,492 B2 * | 8/2007 | Olsson et al. | 425/143 |
| 7,281,920 B2 * | 10/2007 | Homola et al. | 425/385 |
| 2003/0017424 A1 * | 1/2003 | Park et al. | 430/322 |
| 2003/0091781 A1 * | 5/2003 | Arakawa et al. | 428/64.4 |
| 2003/0194464 A1 * | 10/2003 | Iida et al. | 425/542 |
| 2004/0036201 A1 | 2/2004 | Chou et al. | |
| 2005/0046058 A1 * | 3/2005 | Suwa et al. | 264/1.33 |
| 2008/0029931 A1 * | 2/2008 | Tada et al. | 264/293 |

FOREIGN PATENT DOCUMENTS

| | | | |
|---|---|---|---|
| JP | 05185499 A | * | 7/1993 |
| JP | 09231619 A | * | 9/1997 |
| JP | 2000323461 A | * | 11/2000 |
| JP | 2001331980 A | * | 11/2001 |
| JP | 2002100079 A | * | 4/2002 |

* cited by examiner

APPARATUS FOR DOUBLE-SIDED IMPRINT LITHOGRAPHY

CROSS REFERENCE TO RELATED APPLICATIONS

This application claims the benefit of U.S. Provisional Patent Ser. No. 60/495,560 filed Aug. 15, 2003 by Stephen Chou, et al. and entitled "Apparatus For Double-Sided Imprint Lithography", which is incorporated herein by reference. This application is also a continuation-in-part of U.S. patent application Ser. No. 10/140,140 filed May 7, 2002 and entitled "Fluid Pressure Imprint Lithography", (now U.S. Pat. No. 7,137,803) which in turn, is a divisional of U.S. patent application Ser. No. 09/618,174 filed Jul. 18, 2000 (now U.S. Pat. No. 6,482,742 issued Nov. 19, 2002). The foregoing '140 application, '174 application and '742 patent are each incorporated herein by reference.

FIELD OF THE INVENTION

This invention relates to apparatus for performing imprint lithography. The apparatus is particularly useful for double-sided imprint lithography wherein registered patterns are imprinted on opposite sides of a substrate.

BACKGROUND OF THE INVENTION

Lithography is a key process in the fabrication of semiconductor integrated circuits and many optical, magnetic and micromechanical devices, including magnetic data storage disks, CD discs and DVDs. Lithography creates a pattern on a thin film carried on a substrate so that, in subsequent process steps, the pattern can be replicated in the substrate or in another material which is added onto the substrate.

Conventional lithography typically involves applying a thin film of resist to a substrate, exposing the resist to a desired pattern of radiation, and developing the exposed film to produce a physical pattern. In this approach, resolution is limited by the wavelength of the radiation, and the equipment becomes increasingly expensive as the feature size becomes smaller.

Nanoimprint lithography, based on a fundamentally different principle offers high resolution, high throughput, low cost and the potential of large area coverage. In nanoimprint lithography, a mold with nanoscale features is pressed into a thin film, deforming the shape of the film according to the features of the mold and forming a relief pattern in the film. After the mold is removed, the thin film can be processed to remove the reduced thickness portions. This removal exposes the underlying substrate for further processing. Details of nanoimprint lithography are described in applicant's U.S. Pat. No. 5,772,905 issued Jun. 30, 1998 and entitled "Nanoimprint Lithography". The '905 patent is incorporated herein by reference.

The usual method of pressing the mold into the thin film involves positioning the mold and the substrate on respective rigid plates of a high precision mechanical press. With such apparatus, the process can generate sub-25 nm features with a high degree of uniformity over areas on the order of 12 square inches. Larger areas of uniformity would be highly advantageous to increase throughput and for many applications such as displays.

In some applications, such as the manufacture of magnetic data storage disks CD discs and DVDs (read, write or both), it is desirable to imprint both major surfaces of an apertured substrate (top and bottom) with patterns that are in radial registration with the centers of the disks precisely aligned. The present invention is directed to apparatus which facilitates such double-sided imprinting.

SUMMARY OF THE INVENTION

Apparatus for double-sided imprint lithography of an apertured substrate comprises a pair of correspondingly apertured molds, a support for an assembly of the substrate and molds, and an alignment mechanism with radially movable elements for aligning the apertures of the molds and the substrate. The movable elements can be at least partially disposed in a spindle and can be moved radially outward by a conically tapered drive rod. Opposing surfaces of the substrate can then be imprinted in registration at the same time, preferably by fluid pressure imprint lithography.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawing are for purposes of illustrating the concepts of the invention and are not to scale.

DETAILED DESCRIPTION

The use of a high precision mechanical press to press a mold into a thin film presents tolerance problems in replicating small patterns over large areas. Presses move on guide shafts through apertures, and the spacings between the shafts and their respective apertures can be large compared to the features to be replicated. Such spacings permit undesirable relative translational and rotational shifts between the substrate and the mold. Moreover, despite the most careful construction, the molds and the substrates used in lithography are not perfectly planar. When these molds and substrates are disposed on the rigid plates of a press, the deviations from planarity over large areas can result in variations in the molding pressure and depth of imprint. Accordingly, it is desirable to provide a method of imprint lithography which avoids the limitations of mechanical presses.

The problem of unwanted lateral movements of mechanical presses is ameliorated by using direct fluid pressure to press together the mold and the moldable surface. The inventive methods apply fluid pressure over a surface of the mold, the substrate supporting the moldable surface or both. Because the fluid pressure is isostatic, no significant unbalanced lateral forces are applied. Direct fluid pressure also includes fluid pressure transmitted to the mold or substrate via a flexible membrane, as the membrane does not interfere with the transmission of isostatic pressure from the fluid. And streaming pressurized fluid from numerous openings in a pressure vessel can also apply nearly isostatic direct fluid pressure on the mold or substrate.

It is contemplated that the invention will have important applications in the molding of registered patterns on opposite sides of a substrate. The molds can be aligned with the substrate and imprinting by direct fluid pressure minimizes any relative lateral shifts with consequent improvement in the alignment of the two patterns.

This description is divided into three parts: Part I describes the method of fluid pressure imprint lithography, Part II describes apparatus for fluid pressure imprint lithography and Part III describes apparatus for double-sided imprint lithography preferably using fluid pressure.

I. Fluid Pressure Imprint Lithography

Figure 1:
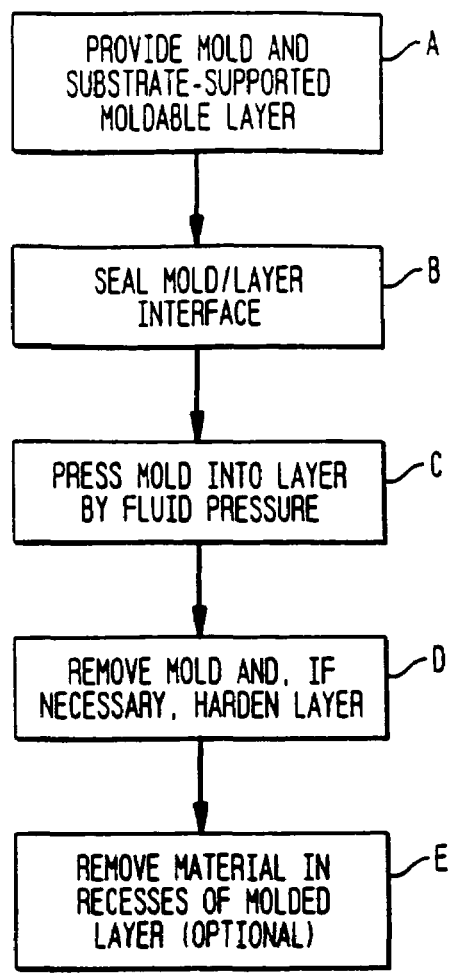
FIG. 1 is a schematic flow diagram of the steps in an improved method of imprint lithography.

Referring to the drawings, FIG. 1 is a schematic flow diagram of an improved process for imprint lithography using direct fluid pressure. An initial step shown in Block A, is to provide a mold having a plurality of protruding features and a substrate-supported thin film of moldable material. The protruding features are preferably micrometer scale features and, more advantageously, nanoscale features. The utility of the method is not limited to imprinting nanoscale features, but it is particularly advantageous where the mold surface has at least two protruding features spaced apart by at least one lateral dimension less than 200 nm. A moldable material is one which retains or can be hardened to retain the imprint of protruding features from a mold surface.

Figure 2:
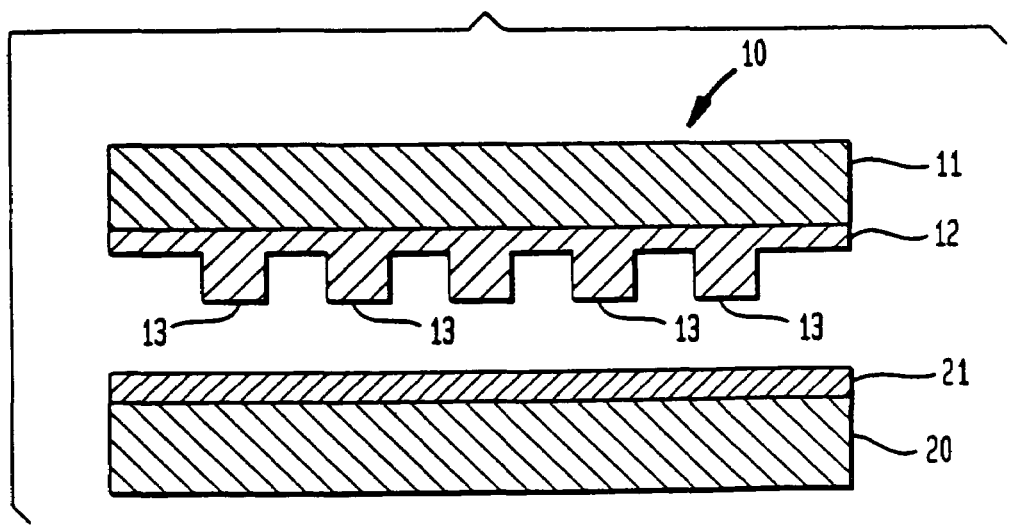
FIG. 2 illustrates a typical mold and a substrate bearing a moldable film for use in the improved method of FIG. 1.

FIG. 2 illustrates a typical mold 10 with protruding features and a substrate 20 bearing a moldable thin film 21 for use in the process of FIG. 1. The mold comprises a body 11 and a molding layer 12 including a plurality of protruding features 13 having a desired shape. The mold body 11 and the molding layer 12 are typically fused quartz, glass or ceramic. They can alternatively comprise polymers, metals, semiconductors or combinations thereof, including multilayer structures. The mold body can be transparent, partially transparent or opaque. The molding layer 12 can be patterned into features 13 using lithographic techniques well known in the art, such as electron beam lithography, focused ion beam lithography, photolithography, laser beam writing or interference lithography. The thickness of layer 21 is typically in the range 0.1 nm-10 µm, and the extent of protruding features 13 is typically in the range 0.1 nm-10 µm.

The substrate typically comprises a semiconductor wafer such as a substantially planar wafer of monocrystalline silicon. The substrate could also be plastic, glass, ceramic, polymer or metal. The moldable thin film 21 can be any polymer that can be made pliable to pressure and can retain a pressure-imprinted deformation or pattern. It can be a thermoplastic polymer, such as polycarbonate or polymethyl methacrylate (PMMA), which temporarily softens in response to heat. Alternatively it can be a liquid, such as a UV-curable silicone, which hardens in response to radiation or a liquid which cures with heat. It can also be a combination of polymer and hardenable liquid, such as a composite layered structure. The thin film is typically applied to the substrate by spraying or spinning. Advantageously the film polymer does not adhere to the mold surface. If necessary, the mold surface can be coated with a release agent to prevent such adherence.

In high resolution applications, the mold and the substrate are advantageously made of the materials with the same or similar thermal expansion characteristics in order to minimize misalignment due to differential thermal expansion or contraction.

Preferably the mold body 11, the substrate 20 (or both) is flexible so that, under the force of fluid pressure, the surfaces of the mold and the substrate will conform despite deviations from planarity. Silicon substrates of thickness less than 2 mm exhibit such flexibility for typical imprint pressures.

The next step, shown in Block B, is to place the mold and the thin-film together and to seal the interface of the mold with the thin film, forming a mold/film assembly. If the thin film already includes a previously formed pattern, then the pattern of the mold should be carefully aligned with the previous pattern on the film, as by the alignment methods described herein. The objective of the sealing is to permit external fluid pressure to press the mold into the film. The sealing can be effected in a variety of ways such as by providing a ring of material such as an elastomeric gasket around the area to be molded and peripherally clamping the assembly.

The third step (Block C) is to press the mold into the film by direct fluid pressure. One method for doing this is to dispose the assembly in a pressure vessel and introduce pressurized fluid into the vessel. The advantage of fluid pressure is that it is isostatic. The resulting force uniformly pushes the mold into the thin film. Shear or rotational components are de minimus. Moreover since the mold and/or substrate are flexible rather than rigid, conformation between the mold and the film is achieved regardless of unavoidable deviations from planarity. The result is an enhanced level of molding resolution, alignment and uniformity over an increased area of the film. The pressurized fluid can be gas or liquid. Pressurized air is convenient and typical pressures are in the range 1-1000 psi. The fluid can be heated, if desired, to assist in heating the moldable thin film. Cooled fluid can be used to cool the film.

Figure 3:
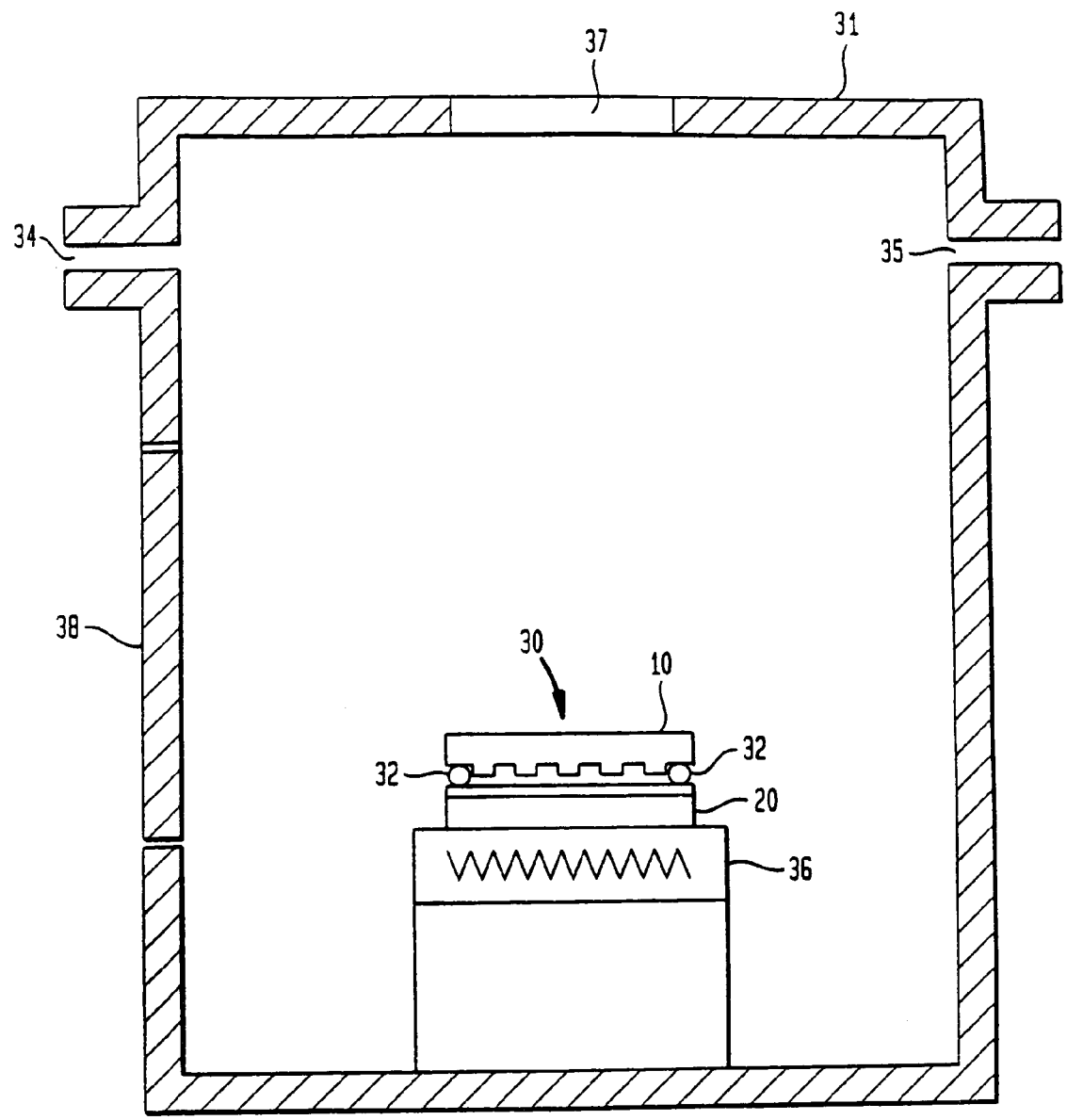
FIG. 3 illustrates apparatus for practicing the improved method of FIG. 1.

FIG. 3 illustrates a sealed mold/film assembly 30 disposed within a pressure vessel 31. The assembly 30 is sealed by a peripheral elastomeric gasket 32, extending around the area to be molded. The periphery of the assembly can be lightly clamped by a clamp (not shown) to effectuate the seal. The vessel 31 preferably includes a valve-controlled inlet 34 for the introduction of pressurized fluid and a valve controlled outlet 35 for the exit of such fluid. The vessel 31 may optionally include a heater 36 for heating a thermoplastic or heat curable thin film and/or a transparent window 37 for introducing radiation to cure or cross link the film. A scalable door 38 can provide access to the interior of the vessel.

The next step shown in Block D, is to harden the moldable thin film, if necessary, so that it retains the imprint of the mold and to remove the mold. The process for hardening depends on the material of the thin film. Some materials may maintain the imprint with no hardening. Thermoplastic materials can be hardened by preliminarily heating them prior to molding and permitting them to cool after imprint. PMMA, for example, can be suitably softened by heating to 180° C. prior to molding and hardened by cooling after imprint. Heat curable materials can be hardened by applying heat during imprint. The above-described heater 36 and/or the use of a heated pressurized fluid can effectuate such hardening. Radiation curable materials can be hardened by the application of UV radiation during imprint. Such radiation can be supplied through the window 37 of the pressure vessel. The mold can be made of transparent material to permit the radiation to reach the film. Alternatively, the substrate can be transparent and the window positioned to illuminate the film through the substrate.

The fifth step shown in Block E is optional in some applications. It is to remove contaminants (if any) and excess material from the recesses of the molded thin film. The molded film will have raised features and recesses. In many lithographic operations it is desirable to eliminate the material from the recesses so that the underlying substrate is exposed for further processing. This can be conveniently accomplished using reactive ion etching.

Figure 4A:
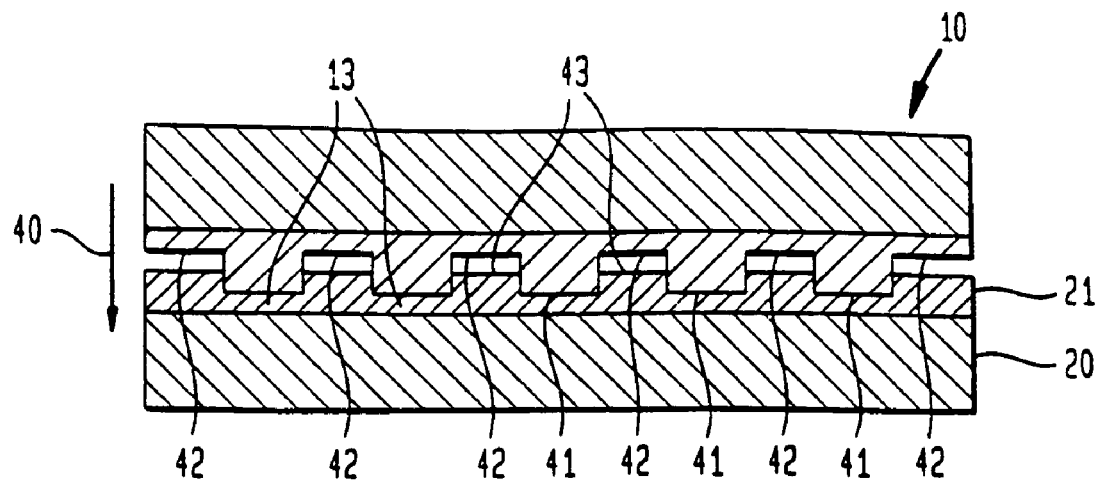
FIGS. 4A, 4B and 4C show the moldable layer and substrate at various stages of the process of FIG. 1.
Figure 4B:
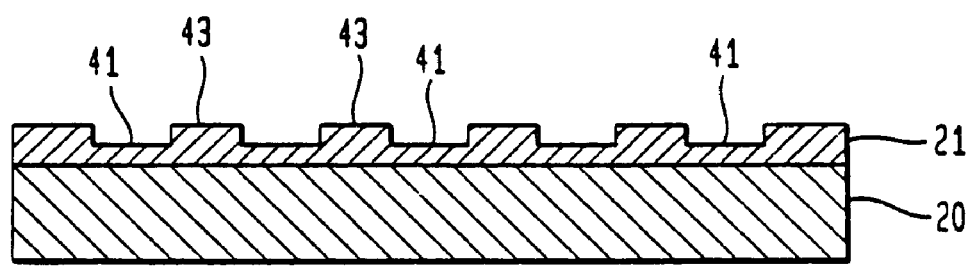
Figure 4C:
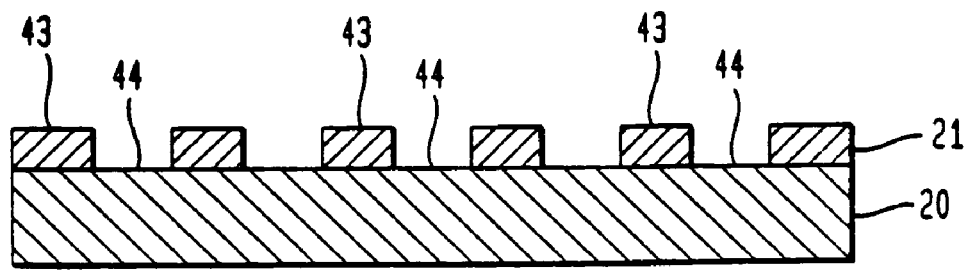

FIGS. 4A, 4B and 4C show the moldable layer and substrate at various stages of the process. FIG. 4A illustrates the layer 21 during imprinting by mold 10 pressed by fluid pressure in the direction of arrow 40. The protruding features 13 of the mold press into layer 21, producing thinned regions 41. The recessed regions 42 of the mold between successive protruding features leave layer 21 with regions 43 of greater thickness.

FIG. 4B shows the layer 21 after hardening and removal of the mold. The layer 21 retains the thinned regions 41 and thick regions 43 in accordance with the pattern imprinted by the mold.

FIG. 4C illustrates the layer and substrate after removal of the excess layer material in the recesses, exposing nanoscale regions 44 of the substrate 20.

In important applications the resulting structure is a resist-covered semiconductor substrate with a pattern of recesses extending to the substrate as shown in FIG. 4C. Such a structure can be further processed in a variety of ways well-known in the art. For example, the molded film can be used as a mask for the removal of surface layers in exposed regions of the substrate, for doping exposed regions or for growing or depositing materials on the exposed regions.

Figure 5A:
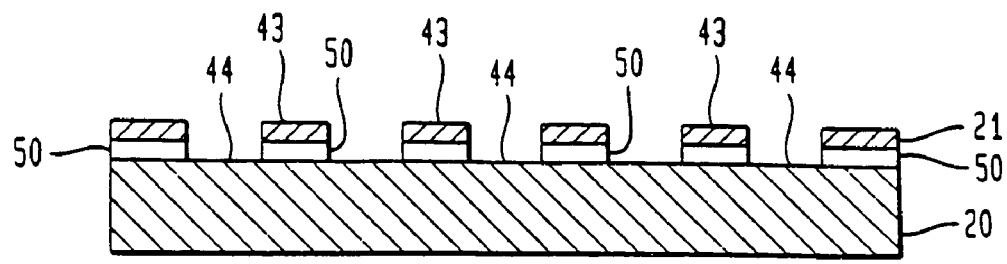
FIGS. 5A, 5B and 5C illustrate various further processing steps that can be performed on the substrate.
Figure 5B:
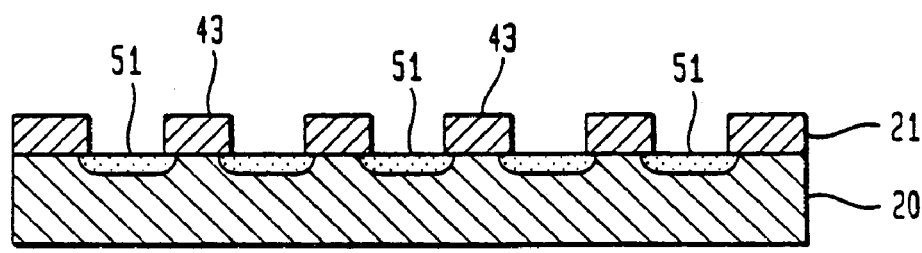
Figure 5C:
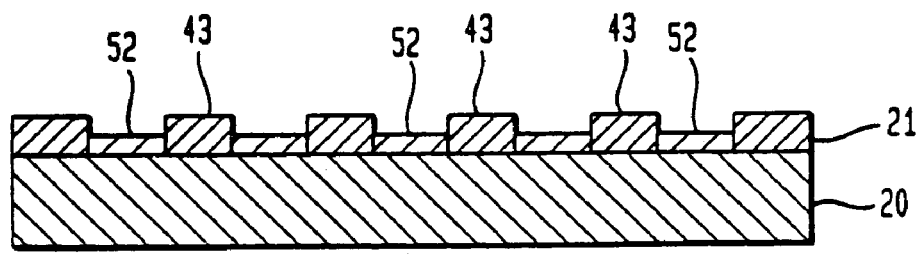

FIGS. 5A, 5B and 5C illustrate such further processing. In FIG. 5A, the substrate can include a surface dielectric layer 50 (such as silicon oxide on silicon) and the mask layer can permit removal of the dielectric at exposed regions. In FIG. 5B impurity regions 51 can be diffused or implanted into the semiconductor selectively in those regions which are exposed, altering the local electrical or optical properties of the doped regions. Alternatively, as shown in FIG. 5C new material layers 52 such as conductors or epitaxial layers can be deposited or grown on the exposed substrate within the recesses. After processing, the remaining material of the molded layer can be removed, if desired, using conventional techniques. PMMA, for example, can be cleaned away by washing with acetone. A substrate can be subjected to additional lithographic steps to complete a complex device such as an integrated circuit.

II. Apparatus for Fluid Pressure Imprint Lithography

We now turn to apparatus useful in performing the process of FIG. 1. As mentioned above, there are a variety of ways of sealing the mold/film assembly 30 so that pressurized fluid will press the mold into the film. FIGS. 6A-6D illustrate several of these ways.

Figure 6A:
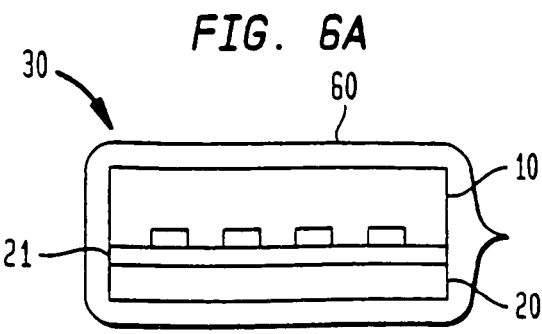
FIGS. 6A-6E illustrate alternative sealing arrangements useful in the method of FIG. 1.

FIG. 6A schematically illustrates an arrangement for sealing a mold/film assembly by disposing the assembly within a sealed covering of flexible, fluid-impermeable membrane 60 (e.g. a plastic bag). In this arrangement the region between the mold and the moldable layer is sealed in relation to an external pressure vessel. Preferably the air is removed from the bag before molding.

Figure 6B:
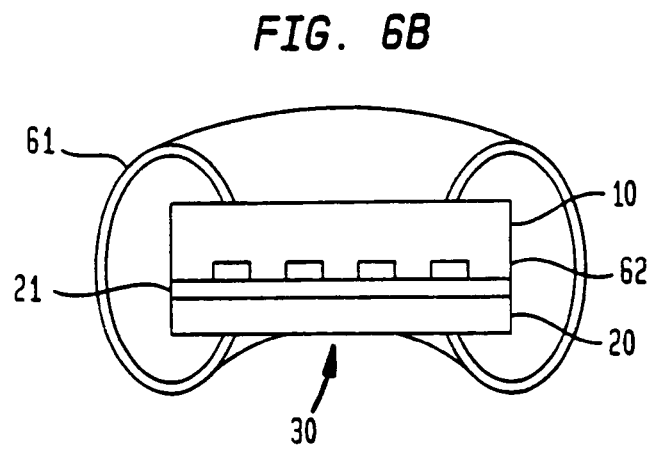

FIG. 6B shows an alternate sealing arrangement wherein the assembly 30 is sealed by a peripheral sealing clamp 61 which can be in the form of a hollow elastic torroid. Sealing can be assisted by providing the mold with a protruding region 62 extending around the region to be molded. In use, the clamp and pressurized fluid will press the protruding region 62 into the moldable film, sealing the molding region.

Figure 6C:
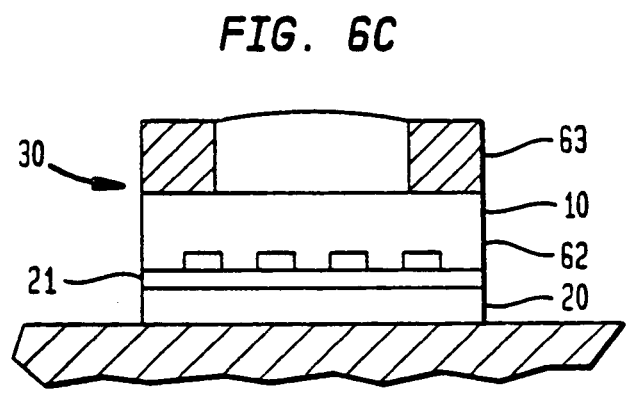

FIG. 6C illustrates a sealing arrangement in which the assembly 30 is sealed by applying a peripheral tube or weight 63 which lightly presses the mold onto the moldable film. A peripheral protruding region 62 can assist sealing.

Figure 6D:
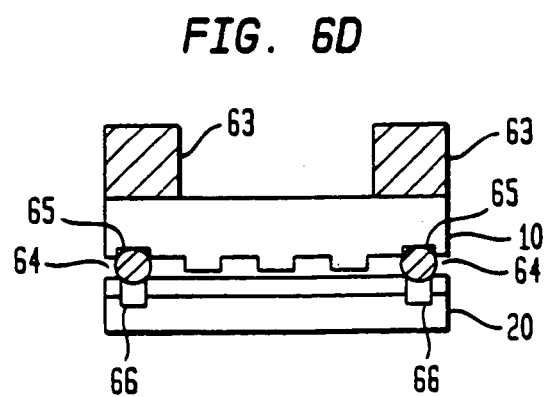

FIG. 6D shows an alternative sealing arrangement wherein the assembly 30 is sealed by a sealing o-ring 64 between the mold and the substrate. Preferably the o-ring seats within peripheral recesses 65, 66 in the mold and the substrate, respectively. Light pressure from a peripheral tube or weight 63 can assist sealing.

Figure 6E:
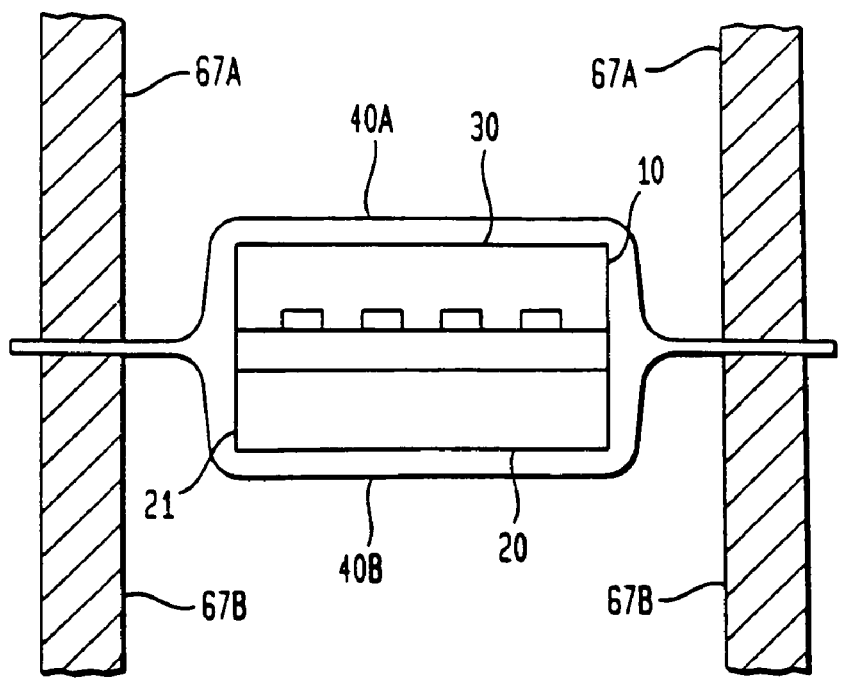

FIG. 6E shows yet another sealing arrangement in which the assembly 30 is disposed between flexible membranes 40A and 40B is enclosed within a pair of mating cylinders 67A, 67B. Application of fluid pressure to the interior of the cylinders would press the mold and moldable surface together.

Alternatively, two the cylinders could lightly seal against the mold and the substrate, respectively, before pressurization. Yet further in the alternative, the substrate could rest upon a support and a single cylinder lightly seal against the mold or a membrane.

Figure 7:
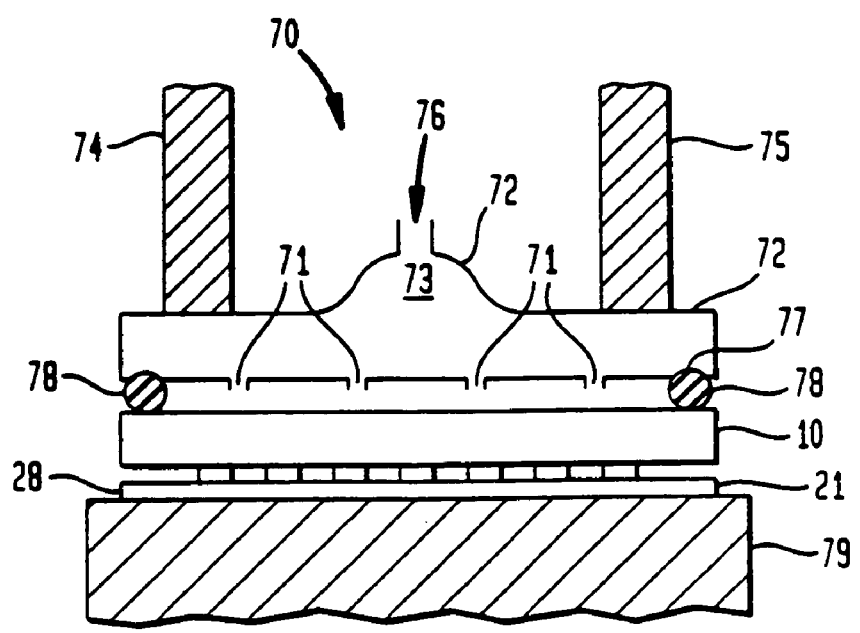
FIG. 7 shows alternative apparatus for practicing the method of FIG. 1.

FIG. 7 illustrates alternative molding apparatus 70 where the assembly is disposed adjacent openings 71 in a hollow pressure cap 72 and the mold 10 is pressed into the moldable layer 21 by jets of pressurized fluid escaping through the openings 71. The cap 72 (analogous to vessel 31) has an internal chamber 73 for pressurized fluid. The region between the mold and the moldable film is effectively sealed from the pressure vessel by the upper surface of the mold.

In operation, the substrate and mold are placed on a substrate holder 79. The cap 72 can be held in fixed position above the mold 10, as by bars 74, 75. High pressure fluid, preferably gas, is pumped into chamber 73 through an inlet 76. The high pressure fluid within the chamber produces a fluid jet from each opening 71. These jets uniformly press the mold 10 against the moldable layer to imprint the mold features.

Advantageously, the cap 72 can include a groove 77 along a perimeter of the face adjacent the mold 10. The groove 77 can hold an o-ring 78 between the cap 72 and the mold 20. The o-ring decreases fluid outflow between the cap 72 and the mold 10, increasing the molding pressure and making it more uniform.

Alternatively, the substrate holder 79 can have the same structure as cap 72 so that the substrate is also pressed by jets of pressurized fluid.

III. Apparatus for Double-Sided Imprint Lithography

Figure 8:
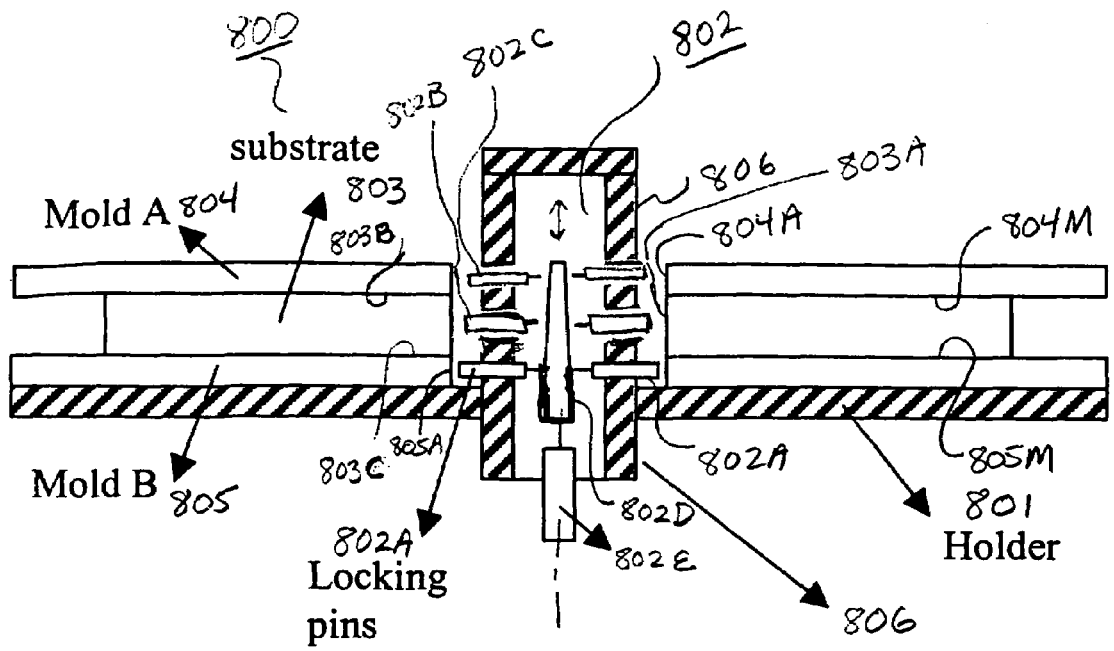
FIG. 8 is a schematic cross section of an arrangement for practicing double-sided imprint lithography.

In some applications, such as in the manufacture of magnetic data storage disks, CDs and DVDs (read, write or both), it is desirable to imprint both major surfaces of a substrate (top and bottom) with patterns that are in registration. FIG. 8 is a schematic cross section of an arrangement 800 for practicing such double sided imprint lithography.

Arrangement 800 comprises, in essence, an assembly support 801 (holder) and an aperture alignment mechanism 802. The support 801 holds an assembly of an apertured substrate 803 and apertured molds 804 and 805. The substrate 803 has an aperture 803A, such as the central aperture of a magnetic disk or a CD disc, and a pair of moldable major surfaces 803B and 803C (such as the top and underside of a CD). The moldable surfaces 803B and 803C of the substrate are materials that deform under the press of the mold and may be hardened thereafter, as by cooling, polymerization, or chemical reaction. They are typically polymer resists such as polymethyl methacrylate (PMMA), polycarbonate, silicone or curable liquid. Alternatively, under appropriate conditions, the moldable materials can be semiconductors, dielectrics, metals, organic compounds or inorganic compounds, all in the form of continuous or discontinuous coatings or layers, mixtures, dispersions, or blends.

The apertured molds 804 and 805 have respective apertures 804A, 805A preferably congruent with the aperture 803A of the substrate. The molds 804 and 805 have respective patterned molding surfaces 804M and 805M. The molds and the substrate are stacked on the support 801 with their respective apertures in approximate alignment and with the molding surfaces adjacent the moldable surfaces of the substrate.

After imprint, 802A, 802B, 802C may move out radially to hold the inner wall of 805, 803 and 804 respectively. Then substrate 803, mold 804, and mold 805 can be separated by radial fluid pressure flow from interior of 802, through open spacings between 802A and 806, 802B and 806, and 802C and 806.

Figure 9:
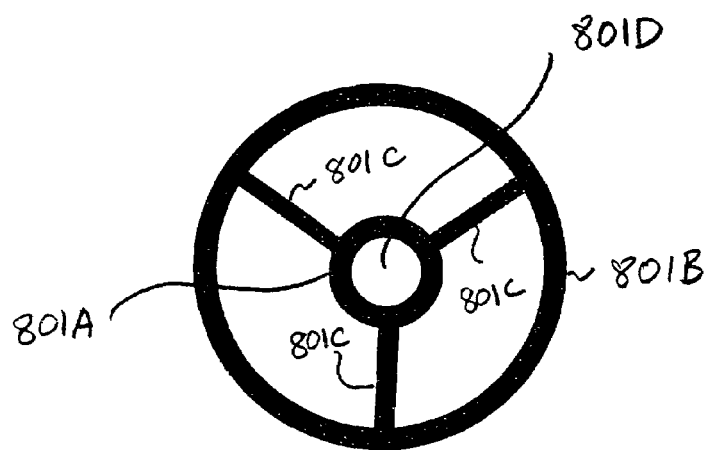
FIG. 9 is a top view of an advantageous assembly support for the arrangement FIG. 8.

FIG. 9 is a top view of an advantageous assembly support 801. The support comprises a pair of concentric circular rings 801A, 801B connected by a plurality of radial spoke members 801C. The aperture 801D in the inner ring 801A is typically smaller in diameter than the substrate aperture 803A, and the outer diameter of ring 801B is typically at least as large as that of the molds 804, 805. The spokes 801C permit an open structure so that if mold 805 is transparent, light can be shone into the mold/substrate interface for heating or curing the moldable surface 803C. The open structure also minimizes the contact area between the support and mold 805, permitting rapid heating and cooling of the substrate.

Referring back to FIG. 8, substrate 803 and molds 804, 805 are stacked and aligned on support 801. Stacking can be facilitated by a centrally disposed cylindrical spindle 806. They are precisely aligned by the alignment mechanism 802 which comprises a plurality of radially movable elements inserted within the apertures of the assembly. In one embodiment, separate sets of the movable elements separately center mold 805, substrate 803 and mold 804 as they are stacked on the support. In the embodiment of FIG. 8, the movable elements are three sets of cylindrical pins 802A, 802B, 802C disposed in openings in the spindle 806. Preferably each set comprises three elements for each assembly component, and the pins of a set are disposed at 120° intervals around the circumference of the spindle. An axially movable conically tapered drive 802D, driven by an axial actuator 802E moves the elements radially out against the aperture walls of the assembly components as they are stacked to effect precise centering and locking into registration. In sequence, mold 805 is placed on the support 801 and is and is centered by the elements of set 802A. The substrate 803 is placed on the mold 805 and is centered by set 802B, and mold 804 is centered by the 802C elements. The tapered (conical) surface of the drive 802D pushes the pins out.

Figure 10:
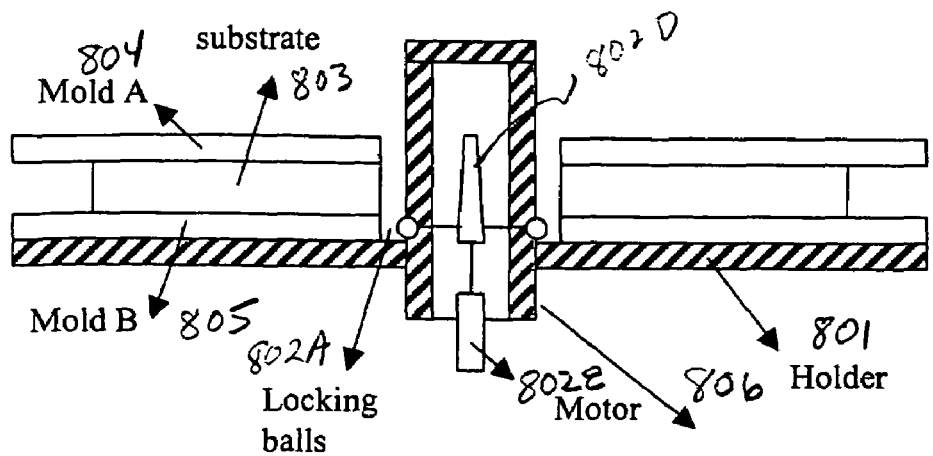
FIG. 10 illustrates an alternative alignment mechanism for the arrangement of FIG. 8.

The centering elements 802A can have any one of a variety of forms. For example, as shown in FIG. 10, they can be in the form of spherical balls. In this embodiment only one set of movable elements 802A is used and the spindle opening through which they pass is in the form of an axial slot. Here, after aligning mold 805, the substrate 803 is stacked and the same set of movable elements 802A is moved axially up to the level of the substrate and then moved radially outward to align the substrate. Similarly, after mold 804 is stacked, the same set of movable elements is moved up and out to align mold 804. In lower tolerance applications, the elements 802A can alternatively be shaped to center all assembly components simultaneously.

After alignment, the mold patterns are imprinted on the opposing surfaces of the substrate in registration. Imprinting is effected by pressing together the components of the assembly. It can be done using mechanical presses as described in U.S. Pat. No. 5,772,905 which is incorporated herein by reference. However, it is preferred that the imprinting be done by the fluid pressure imprint lithography described herein. The advantages are enhanced resolution, uniformity over an increased area, and registration accuracy.

Figure 11:
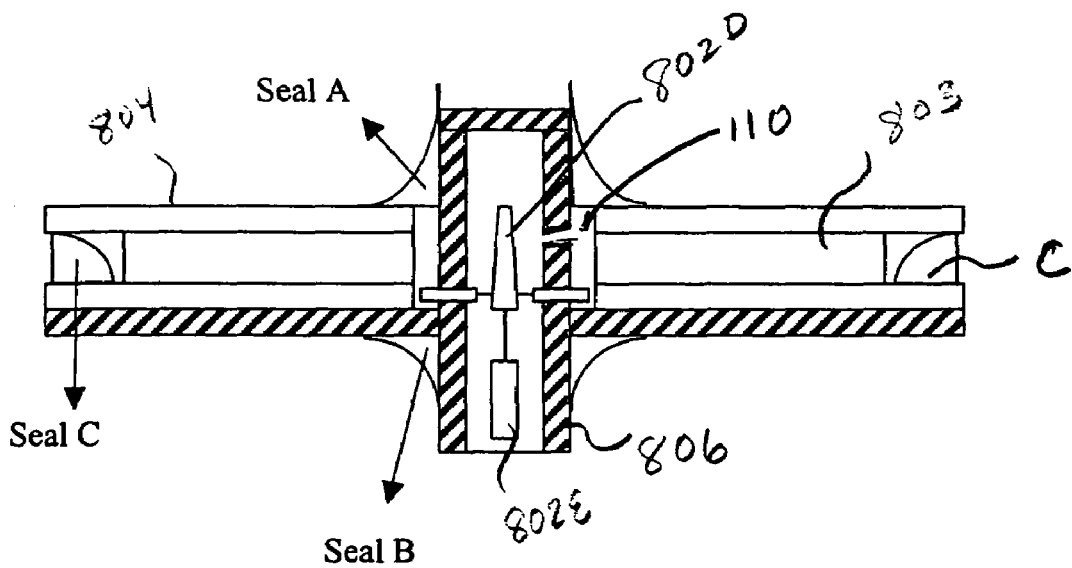
FIG. 11 shows the sealing of the mold/substrate interfaces for imprinting by fluid pressure lithography.
Figure 12:
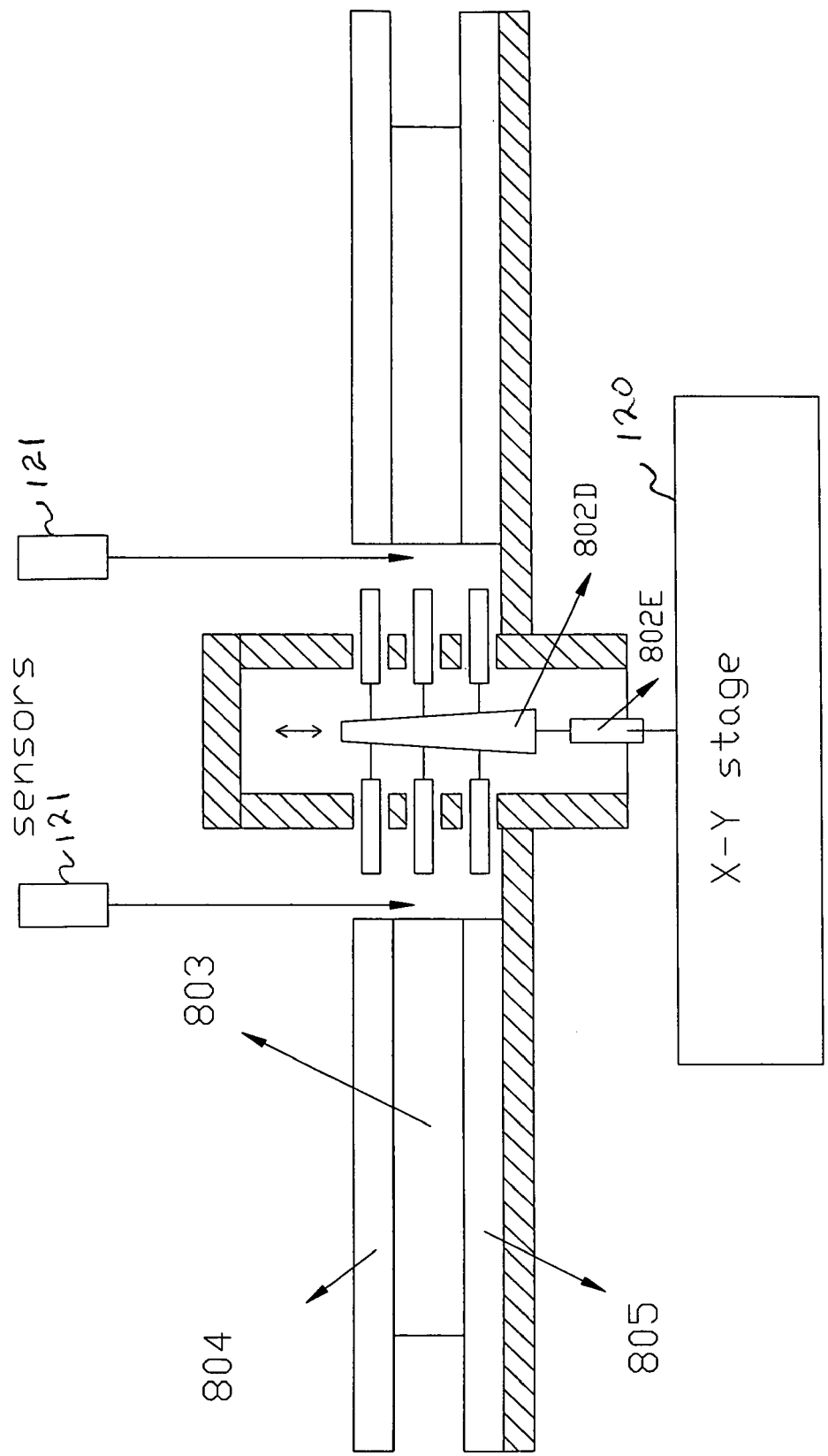
FIG. 12 illustrates a modified form of the FIG. 8 apparatus employing an x-y stage alignment mechanism.

In preparation for imprinting using fluid pressure imprint lithography, the mold/substrate interfaces are sealed as illustrated in FIG. 11. Air between the molds and the substrate is advantageously removed as by evacuation through spindle openings 110, and seals A, B and C are applied to seal the interfaces. Seals, A and B can be O-rings. Seal C can be resilient material soft enough to deform under the mold.

Imprinting is then effected by applying fluid pressure as described above. As set forth above, the fluid pressure can be in the range 1-1000 psi. The pressure quickly and uniformly presses the molds into the moldable surfaces of the substrate. Advantageously, the resist is hardened before removing the mold, as by cooling or by curing with radiation or heat.

After imprinting the substrate and the molds are separated. This separation can be facilitated by introducing gas into the mold/substrate interface, as through spindle openings 110.

The imprinted moldable surfaces, cured or hardened as described above, can be used for many applications such as CDs and DVDs. Alternatively, the imprint-thinned portions of the moldable surfaces can be selectively removed, as by reactive ion etching, to expose the substrate for further processing. For example, the exposed portions of a semiconductor substrate such as silicon can be doped to desired type and degree of conductivity by techniques well known in the art.

In some applications, the very edge of the substrate 803 needs to be patterned. Seal C acts as a spacer, preventing mold 804 and 805 from bending, and therefore the edge of the substrate can be imprinted to achieve higher registration. An x-y two degree movement stage 120 may be connected with 802D and 802E. Sensors 121 can be used to detect the inside edges or outside edges of the substrate 803, mold 804 and mold 805 respectively, and the stage 120, in response to the sensors 121, will then move the substrate 803 and mold 804 in their respective radial planes to align them with mold 805. This approach takes the advantage that the molds 804, 805 and substrate 803 have good concentricity.

Figure 13:
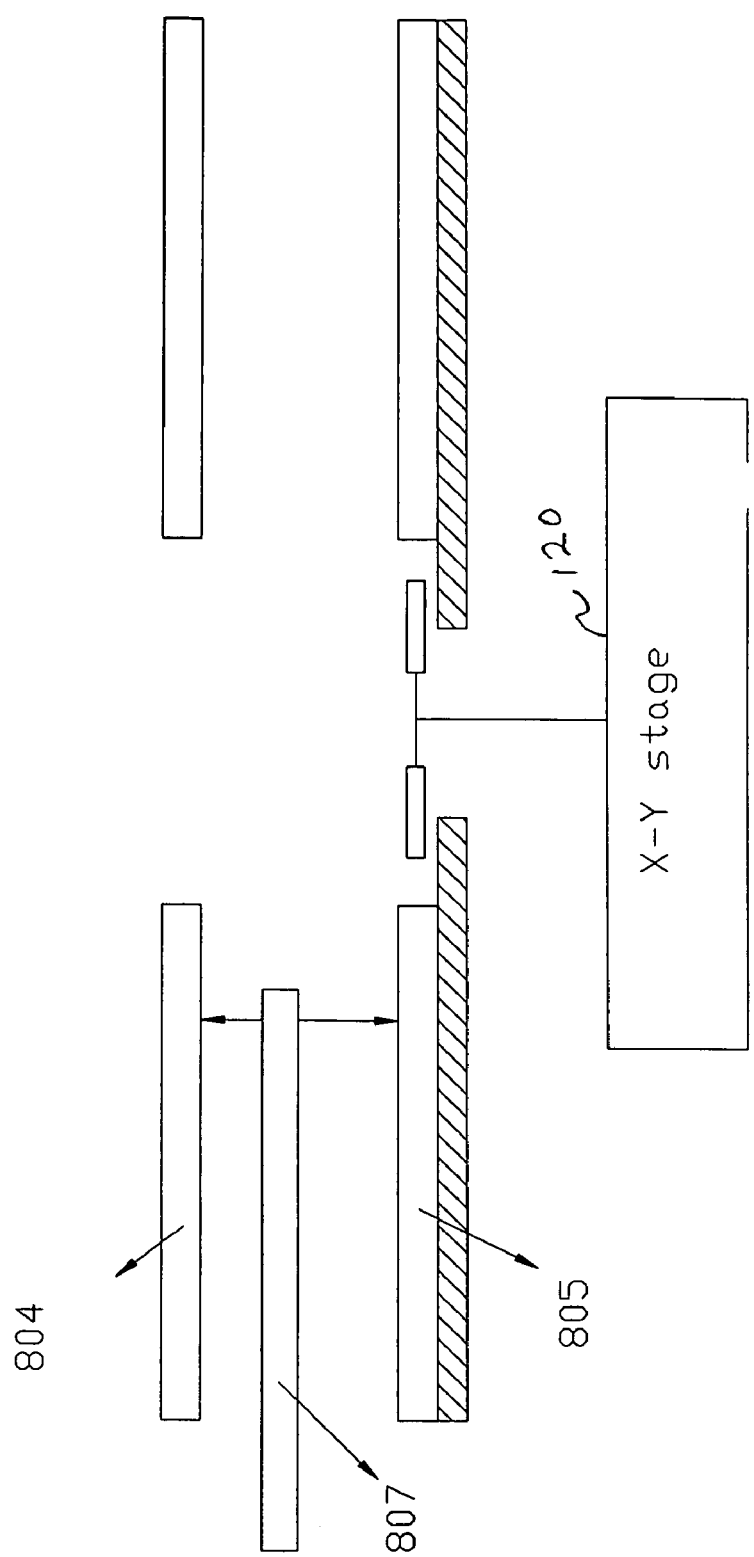
FIG. 13 shows the advantageous use of an optical microscope in alignment.

As shown in FIG. 13, an optical microscope 807 may also be used in conjunction with an x-y stage 120 to assist the alignment. The microscope 807 can be inserted between the mold 804 and 805, and can be used to detect the alignment marks on the mold 804 and 805 respectively. Then molds 804 and 805 can be aligned by the x-y stage. The substrate 803 can then be inserted. Alignment marks on 803 and 805 (or 803 and 804) can be detected by the optical microscope 807, and the x-y stage 120 used for alignment. If the mold material is transparent, one or more optical microscopes can be disposed overlying mold 804 or underneath mold 805.

Figure 14A:
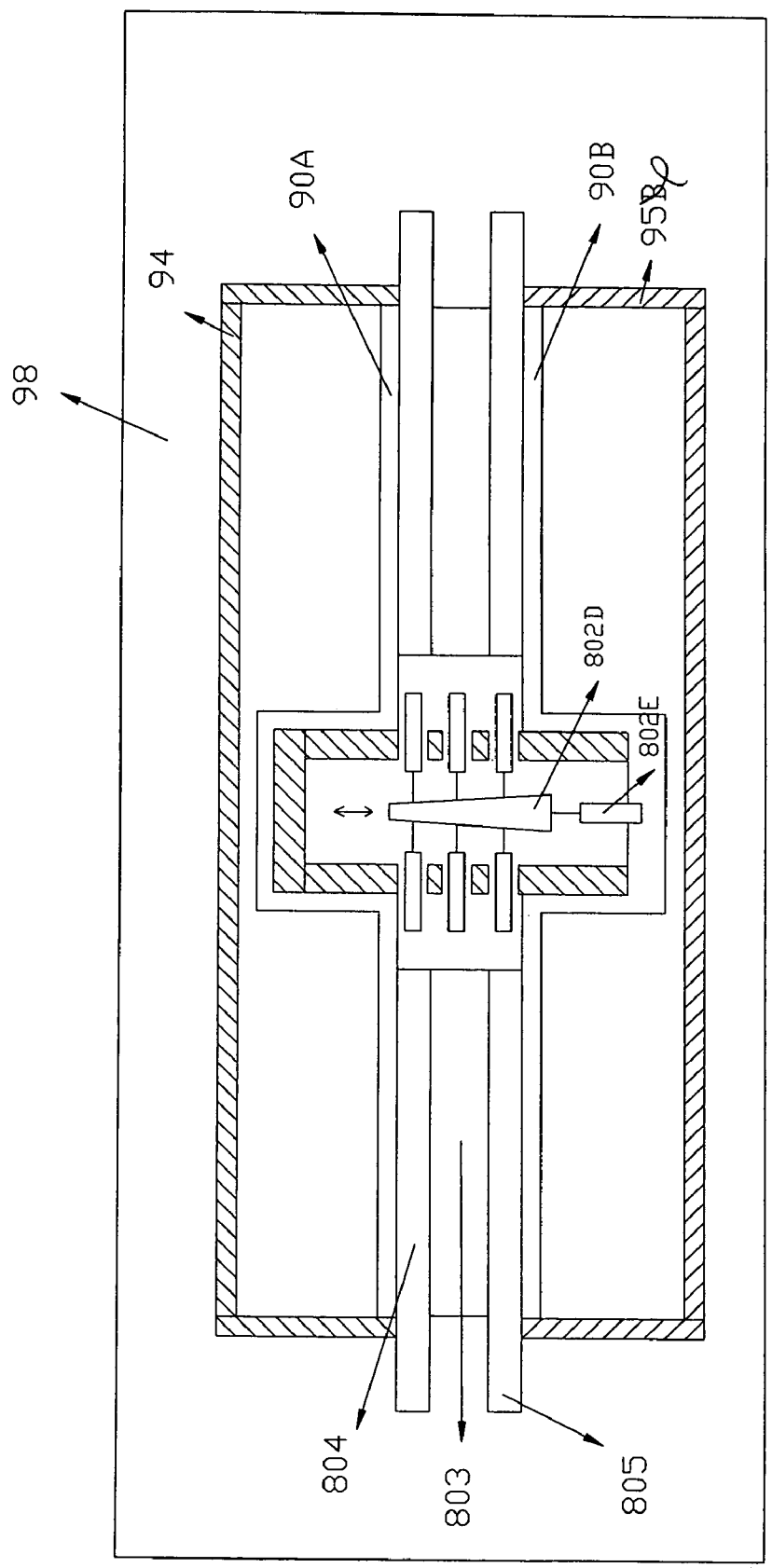
FIGS. 14A and 14B illustrate alternative ways of effecting the pressing step.

After alignment, the molding surfaces are pressed into the moldable surfaces. FIG. 14A illustrates advantageous apparatus for pressing by fluid pressure.

FIG. 14A shows a sealing arrangement in which the assembly 800 is placed between flexible membranes 90A and 90B. Membrane 90A and wall 94 form a first chamber; membrane 90B and wall 95 form a second chamber. Application of fluid pressure to the interior of these two chambers presses the molds and the moldable surfaces together. The above arrangement (including assembly 800, wall 94, wall 95, membranes 90A and 90B) can alternatively be put into a larger chamber 98. Vacuum may be applied to chamber 98 to evacuate the air trapped between the molds and the moldable surfaces before imprint. After imprint, fluid pressure may subsequently be applied to 98 to separate molds from their moldable surfaces.

Alternatively membrane 90B and wall 95 may be replaced with a solid supporting surface. In this case, fluid pressure need only be applied from one side of the assembly, e.g. via the chamber formed by wall 94 and membrane 90A.

Figure 14B:
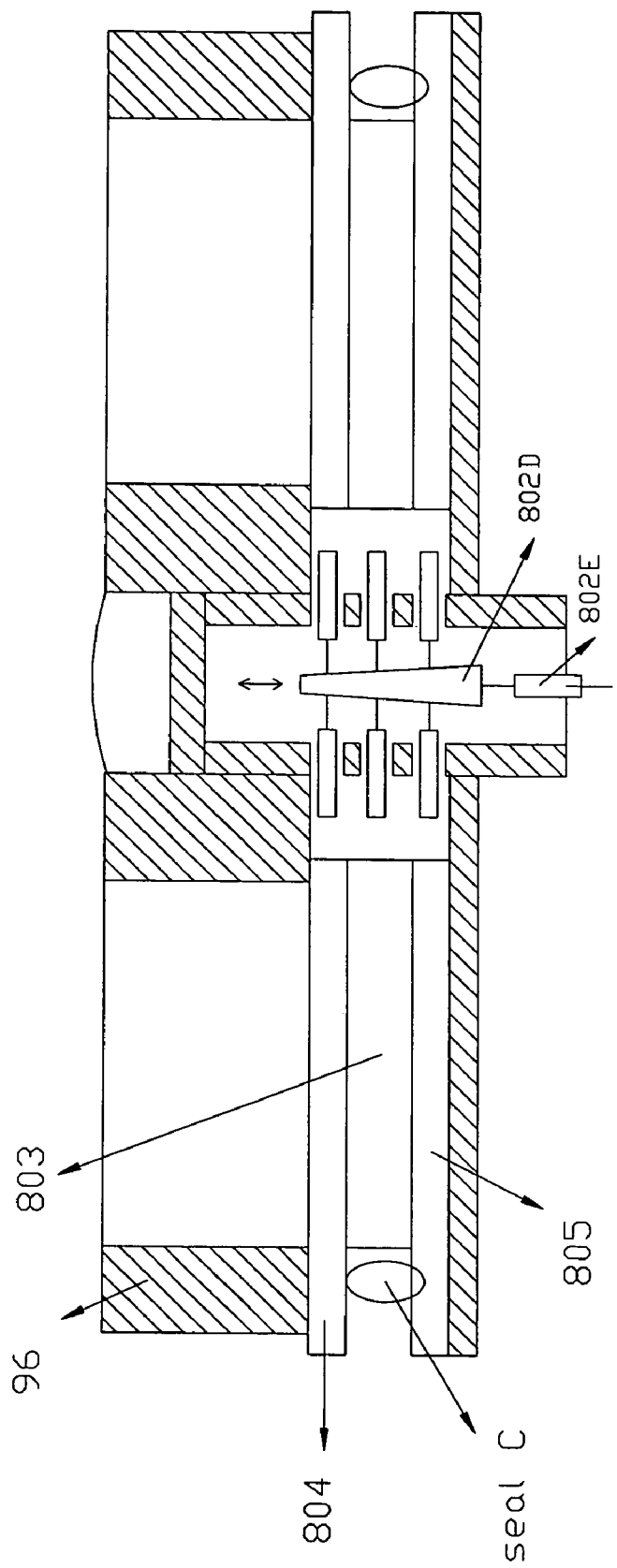

FIG. 14B illustrates an imprint arrangement in which the assembly 800 is sealed by applying a hollow peripheral tube or weight 96 which lightly presses the mold onto the moldable film. Seal C can be disposed between the two molds.

While fluid pressure is the preferred method for pressing the molding surfaces into the moldable surfaces, other approaches can be used, particularly in applications not requiring nanoscale resolution. For example, pressing can be effected by a mechanical press. In this case it is advantageous that the press plates have the same outside diameter as a substrate 803 and that the press plates also be axially aligned with the substrate and molds. Alternatively, the pressing can be effected by field induced pressure, e.g. electrostatic force, as described in U.S. patent application Ser. No. 10/445,578 filed by Stephen Chou et al. on May 27, 2003 and entitled "Methods and Apparatus of Field-Induced Pressure Imprint Lithography", which is incorporated herein by reference.

In some application, the substrate and molds may not be in round shapes, and the alignment can be done with a set or multiple sets of x, y and rotation stages and related sensors. The alignment can be performed manually or automatically with computer vision and control.

The imprint and alignment methods presented here also can be applied to imprint of micro and nanostructures in materials other than resist, where these materials can be a part of devices to be manufactured.

It can now be seen that in one aspect, the invention is an apparatus for performing double-sided imprint lithography on a substrate having an aperture and first and second moldable major surfaces. The apparatus comprises first and second molds, each mold having an aperture and a molding surface for imprinting a pattern on a moldable surface. An assembly support provides support for an assembly comprising the first mold, the substrate and the second mold, the molding surfaces adjacent respective moldable surfaces. An alignment mechanism is provided for aligning the apertures of the molds and the substrate so that the patterns of the molds are in registration, and means such as a pressure chamber are provided for pressing the molding surfaces into the respective adjacent moldable surfaces.

The alignment mechanism can comprise a plurality of radially movable elements which, disposed within the apertures, radially move against the aperture walls to align the apertures. There can be three sets of axially spaced radially movable elements to align the first mold, the substrate and the second mold, respectively. Or one set of radially movable elements can be axially moved to align the first mold, the substrate and the second mold in sequence. Yet further in the alternative, there can be one set of radially movable elements to align the molds and the substrate simultaneously. The radially movable elements are advantageously driven by an axially movable drive rod that can be disposed within a central spindle.

In another aspect, the invention comprises a method of fabricating double-sided imprinted products, such as magnetic disks CD discs and DVDs, comprising the steps of aligning an assembly of apertured substrate and apertured molds, the substrate having a pair of opposing moldable major surfaces and the molds having respective molding surfaces adjacent the moldable surfaces. The mold/substrate interfaces are sealed, and the aligned assembly is subjected to pressurized fluid to press the molding surfaces into the moldable surfaces, simultaneously imprinting registered mold patterns on the moldable surfaces. In advantageous embodiments, the assembly is aligned by radially movable elements centering the apertures.

It is to be understood that the above described embodiments are illustrative of only a few of the many embodiments which can represent applications of the invention. Numerous and varied other arrangements can be made by those skilled in the art without departing from the spirit and scope of the invention.

What is claimed is:

1. An apparatus for performing double-sided imprint lithography on a substrate having an axial aperture and first and second moldable major surfaces comprising:
    first and second molds, each mold having an axial aperture, and a molding surface for imprinting a pattern on a moldable surface;
    an assembly support for supporting an assembly comprising the first mold, the substrate and the second mold, wherein the molding surfaces of the first and second molds are disposed adjacent to said respective first and second moldable major surfaces of the substrate;
    an alignment mechanism coupled to the assembly support, said alignment mechanism including a spindle having an alignment axis and containing at least one set of symmetrically positioned and radially-movable elements disposed in a common plane perpendicular to said alignment axis for axially aligning the apertures of the molds and the substrate about said alignment axis so that the patterns of the molds are in registration;
    a drive mechanism configured to engage each set of radially-movable elements within said spindle of said alignment mechanism, said drive mechanism configured to alter at least a radial position of each of said elements in said set within said common plane; and
    means for pressing the molding surfaces into the respective adjacent moldable surfaces.

2. The apparatus of claim 1 wherein the means for pressing comprises a pressure chamber for receiving the apparatus of claim 1.

3. The apparatus of claim 1 wherein said radially movable elements are configured to engage against the aperture walls of the first and second molds and the substrate to align the respective apertures.

4. The apparatus of claim 1 wherein a first set of radially movable elements is axially disposed within said spindle to engage and to axially align the aperture of said first mold, a second set of radially moveable elements is axially disposed within said spindle to engage and to axially align the aperture of said substrate and a third set of radially movable elements is axially disposed within said spindle to engage and to axially align the aperture of said second mold.

5. The apparatus of claim 1 wherein said set of radially movable elements is axially movable within the spindle to selectively align the apertures of disposed for aligning each of the first mold, the substrate and the second mold in sequence.

6. The apparatus of claim 1 wherein said set of radially movable elements is configured within said spindle to axially align the respective apertures of each of said first and second molds and the substrate simultaneously.

7. The apparatus of claim 1 wherein the drive mechanism comprises an axially movable conical driving rod.

8. The apparatus of claim 1 wherein the molding surface of at least one of the molds has at least two protruding features spaced apart by a lateral dimension less than 200 nanometers.

9. The apparatus of claim 8 wherein the extent of the protruding features is in the range 0.1 nanometers to 10 micrometers.

10. The apparatus of claim 1 wherein the molding surface comprises release material.

11. The apparatus of claim 1 wherein the radially movable elements comprise cylindrical pins passing through openings in said spindle.

12. The apparatus of claim 1 wherein the radially movable elements comprise spherical balls disposed within axial slots in said spindle.

13. The apparatus of claim 1 wherein said drive mechanism consists of an x-y two degree movement stage disposed perpendicular to said spindle axis and coupled to an axially movable conically tapered member disposed within said spindle and driven by an axial actuator; wherein said axial actuator is configured to axially position said conically tapered member at an axial position to engage said set of radially movable elements, and wherein said x-y two degree movement stage is configured to alter a radial position of said radially movable elements by altering a radial position of said conically tapered member in engagement with said set of radially movable elements.

14. The apparatus of claim 1 further including at least one sensor configured to detect an edge of each of said first and second molds, and of said substrate, and wherein said alignment mechanism is operatively coupled to said at least one sensor and responsive to an output there from to selectively alter an alignment of an aperture of at least one of said first mold, said second mold, and said substrate.

* * * * *

UNITED STATES PATENT AND TRADEMARK OFFICE
CERTIFICATE OF CORRECTION

PATENT NO. : 7,717,696 B2
APPLICATION NO. : 10/918564
DATED : May 18, 2010
INVENTOR(S) : Stephen Y. Chou et al.

It is certified that error appears in the above-identified patent and that said Letters Patent is hereby corrected as shown below:

Col. 10, Claim 5, Line 66
Remove "disposed for aligning" as indicated in Amendment C, filed October 28, 2009.

Signed and Sealed this
Nineteenth Day of July, 2011

David J. Kappos
*Director of the United States Patent and Trademark Office*